US012559704B2

(12) United States Patent
Thomas et al.

(10) Patent No.: US 12,559,704 B2
(45) Date of Patent: **\*Feb. 24, 2026**

(54) MICROELECTRONIC DEVICE CLEANING COMPOSITION

(71) Applicant: Entegris, Inc., Billerica, MA (US)

(72) Inventors: Elizabeth Thomas, New Milford, CT (US); Michael L. White, Ridgefield, CT (US); Atanu K. Das, Southbury, CT (US); Daniela White, Ridgefield, CT (US); YoungMin Kim, Suwon-si (KR); Jun Liu, Newtown, CT (US)

(73) Assignee: Entegris, Inc., Billerica, MA (US)

( \* ) Notice: Subject to any disclaimer, the term of this patent is extended or adjusted under 35 U.S.C. 154(b) by 848 days.

This patent is subject to a terminal disclaimer.

(21) Appl. No.: 17/491,750

(22) Filed: Oct. 1, 2021

(65) Prior Publication Data

US 2022/0106541 A1 Apr. 7, 2022

Related U.S. Application Data

(60) Provisional application No. 63/087,710, filed on Oct. 5, 2020.

(51) Int. Cl.
| | |
|---|---|
| *C11D 3/30* | (2006.01) |
| *C11D 1/00* | (2006.01) |
| *C11D 3/04* | (2006.01) |
| *C11D 3/20* | (2006.01) |
| *C11D 3/22* | (2006.01) |
| *C11D 3/32* | (2006.01) |
| *C11D 3/33* | (2006.01) |
| *C11D 3/36* | (2006.01) |
| *C11D 7/32* | (2006.01) |
| *C11D 7/36* | (2006.01) |
| *C11D 7/50* | (2006.01) |
| *H01L 21/02* | (2006.01) |

(52) U.S. Cl.
CPC .............. *C11D 7/3218* (2013.01); *C11D 1/00* (2013.01); *C11D 3/042* (2013.01); *C11D 3/2006* (2013.01); *C11D 3/2075* (2013.01);

*C11D 3/2079* (2013.01); *C11D 3/2082* (2013.01); *C11D 3/22* (2013.01); *C11D 3/30* (2013.01); *C11D 3/323* (2013.01); *C11D 3/361* (2013.01); *C11D 7/36* (2013.01); *C11D 7/5022* (2013.01); *H01L 21/02057* (2013.01); *C11D 2111/22* (2024.01)

(58) Field of Classification Search
CPC ......... C11D 1/00; C11D 3/042; C11D 3/2006; C11D 3/2075; C11D 3/2079; C11D 3/2082; C11D 3/22; C11D 3/30; C11D 3/323; C11D 3/361
USPC ....... 510/175, 475, 477, 488, 499, 500, 504, 510/505, 506
See application file for complete search history.

(56) References Cited

U.S. PATENT DOCUMENTS

| | | | |
|---|---|---|---|
| 6,344,157 | B1 | 2/2002 | Cheng |
| 9,074,170 | B2 | 7/2015 | Barnes |
| 2009/0032057 | A1 | 2/2009 | McCormick |
| 2009/0107520 | A1 | 4/2009 | Lee |
| 2016/0152926 | A1 | 6/2016 | Minsek |
| 2020/0024554 | A1 | 1/2020 | White |
| 2020/0071642 | A1 | 3/2020 | Thomas |
| 2020/0115661 | A1 | 4/2020 | Grandstrom |
| 2021/0395645 | A1 | 12/2021 | Kamimura |
| 2023/0323248 | A1* | 10/2023 | Wang .................. C11D 3/0042 510/175 |

FOREIGN PATENT DOCUMENTS

| | | |
|---|---|---|
| CN | 110506100 A | 11/2019 |
| JP | 2001339142 A | 12/2001 |
| WO | 2012067962 A1 | 5/2012 |
| WO | 2020131313 A1 | 6/2020 |

\* cited by examiner

*Primary Examiner* — Gregory R Delcotto

(57) ABSTRACT

A composition for cleaning a microelectronic device substrate is provided. The composition is useful for cleaning in-process microelectronic device substrates possessing exposed cobalt, molybdenum, copper, molybdenum, tungsten, and dielectric surfaces. Also provided is a method for cleaning such devices and a kit comprising one or more of the components of the composition.

16 Claims, No Drawings

MICROELECTRONIC DEVICE CLEANING COMPOSITION

FIELD OF THE INVENTION

The invention generally relates to aqueous compositions for cleaning the surface of a microelectronic device substrate, such as for cleaning residue from the surface of a microelectronic device substrate.

BACKGROUND OF THE INVENTION

Microelectronic device substrates are used for preparing integrated circuit devices. The microelectronic device substrate includes a base, such as a silicon wafer having a highly planar surface. Onto the planar surface of the base, by way of many multiples of selective placement and removal steps, regions of electronically-functional features are added. The features are made by selectively adding and removing electronically-functional materials that exhibit insulative, conductive, or semi-conductive properties. These electronically-functional materials are placed as desired by use of processing materials that include photoresist, chemical etchant, and slurries that contain abrasive particles and chemical materials that aid in processing the surface.

One feature of integrated circuits is an array of conductive "interconnects," which are also referred to as "lines" and "vias." As part of an integrated circuit, conductive interconnects function to conduct electric current among and between various other electronic features. Each interconnect is in the form of a line or thin film of conductive material that extends within and is defined (in shape and size) by openings formed in an insulative material, i.e., a dielectric material such as a dielectric material. The dielectric material acts as an insulator between the very-closely spaced interconnect structures, and between the interconnect structures and other electronic features of the integrated circuit.

The types of materials used to produce the interconnect and the dielectric structures must be selected to properly function as part of an integrated circuit that performs at high efficiency and high reliability. For example, the conductive material of an interconnect should be of a type that does not migrate (e.g., diffuse) excessively into an adjacent dielectric material over time and during use in the presence of a voltage between the materials; such migration of interconnect material into an adjacent dielectric material is often referred to as "electromigration." At the same time, the combined interconnect and dielectric material structure must have sufficient integrity, including at an interface between these materials, to result in a low level of defects and a high level of performance reliability. For example, a strong bond must exist at the interface to prevent separation of the dielectric material from the interconnect material during use.

Interconnects have in the past been commonly made of aluminum or tungsten, and more recently are made of copper. Copper has an advantageously high conductivity relative to aluminum and tungsten. In addition, copper-based interconnects offer better resistance to electromigration as compared to aluminum, thereby improving the reliability of the integrated circuit over time. Still, copper ions can tend to diffuse into silicon dioxide ($SiO_2$) under sufficient electrical bias, and adhesion of copper to silicon dioxide and to other dielectric materials can be poor.

To prevent these negative interactions of copper with a dielectric material, recent integrated circuit structures have been designed to include a barrier layer between a copper interconnect structure and an adjacent dielectric material.

Example barrier layers may be conductive materials or non-conductive materials, examples including tantalum (Ta), tantalum nitride ($TaN_x$), tungsten (W), titanium (Ti), titanium nitride (TiN), ruthenium (Ru), cobalt (Co), molybdenum (Mo), rhenium (Rh), and alloys thereof.

Processes of placing the various features of microelectronic devices onto a substrate include selectively placing insulative materials (e.g., dielectric. etc.), semiconducting materials, metal materials (e.g., conductive lines and vias (i.e., interconnects), etc., onto a substrate surface. Selective placement and removal of these materials may involve the use of process compositions such as photoresist, etchant, CMP slurries that contain abrasive and chemical materials, and plasma, among others, in steps such as photoresist coating, etching (e.g., wet etching, plasma etching), chemical-mechanical processing (a.k.a., chemical-mechanical polishing, chemical-mechanical planarization, or simply "CMP"), and ashing ("plasma ashing").

Chemical-mechanical processing is a process by which very small amounts (thicknesses) of material are precisely removed from a surface of a microelectronic device substrate to polish (or "planarize") the surface in preparation for a subsequent layer of material to be applied onto the processed surface. Chemical-mechanical processing involves highly precise mechanical abrasion of a surface, coupled with controlled interactions of chemical materials, such as oxidation, reduction, or chelation of a material that is present at or removed from the surface. Often, one type of material at the substrate surface (e.g., metal overburden) is preferentially removed, with high selectivity, in comparison to a reduced degree of removal of one or more other materials that are also present at the surface (e.g., dielectric material).

A CMP process involves applying a "slurry" to the surface along with contacting the surface with a moving CMP pad. The "slurry" is a liquid composition that contains microabrasive particles that provide mechanical abrasion of the surface, along with chemical materials that interact chemically with materials of the surface to facilitate selective removal of certain material from the surface and, often, to inhibit removal of another surface material. The slurry is applied to the surface while the CMP pad contacts the surface with the desired amount of pressure and motion to facilitate the abrasive and chemical removal of select materials from the surface. The combination of the mechanical action of the pad and abrasive particles moving against the surface, along with the action of the chemical ingredients, achieves desired removal, planarization, and polishing of the surface with desired low levels of defects and residue. The CMP process should produce a highly planar, low-defect, low-residue surface to which a subsequent layer of a microelectronic device can be applied.

After a processing step (e.g., chemical-mechanic processing, etching, ashing, etc.), at least some amount of residue will be present at a surface of a substrate. Residue may include abrasive particles from a CMP slurry or other processing material; active chemical ingredients that are part of a CMP slurry (e.g., oxidizer, catalyst, inhibitor) or other processing composition (e.g., etchant); a reaction product or by-product of a processing material or ingredient thereof; a chemical etchant; photoresist polymer or other solid processing ingredient; etc. Any such residue must be removed by cleaning the surface before performing a subsequent step of a microelectronic device fabrication process, to avoid defects or other potential sources of reduced device performance or reliability.

Certain methods and equipment commonly used for cleaning a surface of a microelectronic substrate, e.g., after an etching step, after a CMP step, or after another step used in fabricating a multi-layer microelectronic device, include those that involve a flow of cleaning solution over the surface in combination with megasonics, jetting, or brushing to remove residue and contaminants. Typical cleaning solutions are alkaline solutions, e.g., containing a suitable hydroxide compound along with other chemical materials that together remove residue from the surface by chemically interacting with the residue. The cleaning solution should be effective to remove a high percentage of residue from a surface, but also must be safe with respect to functional features of the substrate. A cleaning solution must not cause damage to those features. For example, a cleaning solution should not cause corrosion (i.e., oxidation) of a metal feature of a substrate, e.g., should not oxidize copper or cobalt metal features of a substrate that may be present as interconnect or barrier features.

New, useful, and improved cleaning compositions and specific ingredients are continually sought, especially for use with new microelectronic device structures such as those that may now include exposed surfaces of tungsten, copper, cobalt, molybdenum, and dielectric materials.

SUMMARY OF THE INVENTION

There is a continuing need for compositions and methods which are effective in removing residues from the surface of an in-process microelectronic device substrate. The present invention provides such compositions and methods, while also inhibiting damage (i.e., corrosion) to certain metal features such as cobalt, copper, molybdenum, and tungsten, as well as dielectric surfaces dielectric materials including but not limited to silicon dioxide, silicon nitride, silicon carbide, silicon oxynitride, silicon oxycarbide, silicon, carbon, dielectrics such as SiLK™ dielectric (Dow Chemical), silsesquioxane, or Black Diamond® PECVD (Applied Materials), which may be present as exposed features on the microelectronic device.

In one aspect, the invention provides a composition comprising:
  a. water;
  b. a complexing agent; and
  c. an amino($C_6$-$C_{12}$ alkyl)alcohol;
wherein said composition is devoid of corrosion inhibitors chosen from a guanidine functional compound, a pyrazolone functional compound, or a hydroxyquinoline compound.

Also provided is a method for cleaning a microelectronic device substrate using such compositions and a kit comprising, in one or more containers, one or more components of the compositions.

DETAILED DESCRIPTION OF THE INVENTION

In a first aspect, the invention provides a composition comprising:
  a. water;
  b. a complexing agent; and
  c. an amino($C_6$-$C_{12}$ alkyl)alcohol;
wherein said composition is devoid of corrosion inhibitors chosen from a guanidine functional compound, a pyrazolone functional compound, or a hydroxyquinoline compound.

In one embodiment, the composition will be comprised of about 60 to 90 weight percent water, about 0.01 to about 10 weight percent of a complexing agent, and about 0.1 to about 5 weight percent, or about 0.1 to about 2 weight percent of an amino($C_6$-$C_{12}$ alkyl)alcohol.

In one embodiment, the composition consists of or consists essentially of components a. through d. above.

As used herein, unless otherwise specified, a composition or ingredient of a composition that is described as "consisting essentially of" one or more specified items refers to a composition or ingredient that is made up of only those specified items with not more than an insubstantial amount of other (additional) materials, e.g., contains only the specified items and not more than 5, 3, 2, 1, 0.5, 0.1, 0.05, or 0.01 weight percent additional ingredients based on the total weight of the composition or the ingredient. As used herein, a composition or ingredient of a composition that is described as "consisting of" one or more specified items refers to a composition or ingredient that is made up of only those specified items.

In certain embodiments, the pH will be acidic, for example from about 1.5 to about 6 and in other embodiments, the pH will be basic, for example from about 9 to about 14. One of ordinary skill in the art will recognize those acids and bases suitable for this purpose.

In one embodiment, the pH adjustor is a base. Non-limiting examples of pH adjustors for this purpose include: choline hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, tetraethylammonium hydroxide (TEAH), tetrapropylammonium hydroxide (TPAH), tetrabutylammonium hydroxide (TBAH), trimethylethylammonium hydroxide, diethyldimethylammonium hydroxide, tributylmethylammonium hydroxide (TBMAH), benzyltrimethylammonium hydroxide (BTMAH), tetramethylammonium hydrochloride (TMAC), tris(2-hydroxyethyl)methyl ammonium hydroxide, diethyldimethylammonium hydroxide, arginine, potassium hydroxide, cesium hydroxide and combinations thereof.

In one embodiment, the pH adjustor is chosen from choline hydroxide and tetraethylammonium hydroxide (TEAH).

In another embodiment, the pH adjustor is an acid, and can be chosen from nitric acid, citric acid, sulfuric acid, phosphoric acid, hydrochloric acid, hydrobromic acid, methanesulfonic acid, benzenesulfonic acid, and p-toluenesulfonic acid, trifluoromethanesulfonic acid, acetic acid, lactic acid, glycolic acid or any combination thereof.

In one embodiment, the complexing agent is chosen from amines, amino acids, and quaternized amino acids including, but not limited to, 4-(2-hydroxyethyl)morpholine (HEM), 1,2-cyclohexanediamine-N,N,N',N'-tetraacetic acid (CDTA), Hydroxyethyldiethylenetraminetriacetic acid (HEDTA), ethylenediaminetetraacetic acid (EDTA), m-xylenediamine (MXDA), iminodiacetic acid (IDA), trimethylamine, isopropanolamine, diisopropanolamine, piperazine, hydroxyethylpiperazine, dihydroxyethylpiperizine, glucamine, N-methylglucamine, 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, taurine, betaine, and combinations thereof.

Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N""-tetrakis(methylenep-hosphonic acid) (DOTP), nitrilotris(methylene)triphosphonic acid, diethylenetriaminepentakis(methylenephosphonic acid) (DETAP), aminotri(methylenephosphonic acid), bis(hexamethylene) triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinic acid, maleic acid, malic acid, malonic acid, adipic acid, phthalic acid, citric acid, sodium citrate, potassium citrate, ammonium citrate, tricarballylic acid, trimethylolpropionic acid, picolinic acid, dipicolinic acid, salicylic acid sulfosalicylic acid, sulfophthalic acid, Sulphosuccinic acid, Betaine anhydrous, gluconic acid, tartaric acid, glucuronic acid, 2-carboxypyridine) and/or sulfonic acids such as (4,5-Dihydroxy-1,3-benzenedisulfonic acid disodium salt. Betaine anhydrous). In certain embodiments, the complexing agent includes nitrilo(tris-methylenephosphonic acid) and iminodiacetic acid. In certain embodiments, the at least one complexing agent comprises a species chosen from monoethanolamine, triethanolamine, sulfuric acid, citric acid and combinations thereof. The amount of complexing agent(s) in the composition is in one embodiment, in a range from about 0.01 wt % to about 10 wt %, based on the total weight of the removal composition.

In one embodiment, the complexing agent is chosen from 1-hydroxyethylidene-1,1-diphosphonic acid; 1,5,9-triazacyclododecane-N,N',N"-tris(methylenephosphonic acid); 1,4,7,10-tetraazacyclododecane-N,N',N",N""-tetrakis(methylenephosphonic acid); nitrilotris(methylene)triphosphonic acid, diethylenetriaminepenta(methylenephosphonic acid); succinic acid, citric acid, ammonium citrate, tartaric acid, iminodiacetic acid, aminotri(methylenephosphonic acid), bis(hexamethylene)triamine phosphonic acid; 1,4,7-triazacyclononane-N,N',N"-tris(methylenephosphonic acid; salts thereof, and derivatives thereof. In one embodiment, the complexing agent is 1-hydroxyethylidene-1,1-diphosphonic acid or a salt thereof.

In one embodiment, the amino($C_8$-$C_{12}$ alkyl)alcohol is chosen from 3-amino-4-octanol; DL-2-amino-1-hexanol; 2-(butylamino)ethanol; 1-aminocyclohexanol; and 8-amino-1-octanol. In one embodiment, the amino($C_6$-$C_{10}$ alkyl) alcohol comprises 3-amino-4-octanol.

As noted above, the composition of the invention is devoid of corrosion inhibitors chosen from a guanidine functional compound, a pyrazolone functional compound, or a hydroxyquinoline compound. In another embodiment, the compositions of the invention are also devoid of corrosion inhibitors chosen from oxalic acid, succinic acid, L-tartaric acid, and combinations thereof. In another embodiment, the compositions are devoid of any corrosion inhibitors.

In another aspect, the invention provides a composition is comprising:
    a. water;
    b. choline hydroxide;
    c. 1-hydroxyethylidene-1,1-diphosphonic acid; or
    d. monoethanolamine; and
    e. an amino($C_6$-$C_{10}$ alkyl)alcohol;

wherein said composition is devoid of corrosion inhibitors chosen from a guanidine functional compound, a pyrazolone functional compound, or a hydroxyquinoline compound.

In one embodiment, the amino($C_8$-$C_{12}$ alkyl)alcohol is chosen from 3-amino-4-octanol; DL-2-amino-1-hexanol; 2-(butylamino)ethanol; 1-aminocyclohexanol; and 8-amino-1-octanol. In another embodiment, the amino($C_8$-$C_{12}$ alkyl) alcohol comprises 3-amino-4-octanol. In another embodiment, the composition consists essentially of components a. through e. above.

In further embodiments of the aspects of the invention, the compositions further comprise a water-dispersible or water-soluble polymer. Such polymers, when present, include, but are not limited to, methacrylic acid homopolymer and copolymers with, for example, acrylamidomethylpropane sulfonic acid and maleic acid; maleic acid/vinyl ether copolymer; poly(vinylpyrrolidone)/vinyl acetate; homopolymers such as phosphonated polyethyleneglycol oligomers, poly(acrylic acid) (PAA), poly(acrylamide), poly(vinyl acetate), poly (ethylene glycol) (PEG), polypropylene glycol) (PPG), poly (styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), polyvinyl pyrrolidone (PVP), PPG-PEG-PPG block copolymers, PEG-PPG-PEG block copolymers, poly(vinyl alcohol), poly(hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly(diallyldimethylammonium) chloride, PEGylated polyethyleneglycol-ated) methacrylate/acrylate copolymers, poly MADQuat (poly(2-methacryloxyethyltrimethylammonium chloride) CAS Number 26161-33-1) and copolymers thereof, dimethylaminomethacrylate polymers and copolymers thereof, trimethylammonium methylmethacrylate polymers and copolymers thereof, and combinations thereof. The copolymers above may be random or block copolymers. When present, the amount of polymer(s) in the composition is in a range from about 0.0001 weight % to about 5 weight %, based on the total weight of the composition.

In a further embodiment, the composition further comprises a surfactant. As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. When present, surfactants for use in the compositions described herein include, but are not limited to, amphoteric salts, cationic surfactants, anionic surfactants, zwitterionic surfactants, non-ionic surfactants, and combinations thereof including, but not limited to, decylphosphonic acid, dodecylphosphonic acid (DDPA), tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid (DDBSA), benzene sulfonic acids or salts thereof, optionally substituted by one or more $C_8$-$C_{18}$ straight or branched-chain alkyl groups, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12-hydroxystearic acid, octadecylphosphonic acid (ODPA), dodecyl phosphate. Non-ionic surfactants contemplated include, but are not limited to, polyoxyethylene lauryl ether, dodecenylsuccinic acid monodiethanol amide, ethylenediamine tetrakis (ethoxylate-block-propoxylate) tetrol, polyethylene glycols, polypropylene glycols, polyethylene or polypropylene glycol ethers, block copolymers based on ethylene oxide and propylene oxide, polyoxypropylene sucrose ether, t-octylphenoxypolyethoxyethanol, 10-ethoxy-9,9-dimethyldecan-1-amine, Polyoxyethylene (9) nonylphenylether, branched, Polyoxyethylene (40) nonylphenylether, branched, dinonylphenyl polyoxyethylene, nonylphenol alkoxylates, polyoxyethylene sorbitol hexaoleate, polyoxyethylene sorbitol tetraoleate, polyethylene glycol sorbitan monooleate, sorbitan monooleate, alcohol alkoxylates, alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives, siloxane modified polysilazanes, silicone-polyether copolymers, and ethoxylated fluorosurfactants. Cationic surfactants contemplated include, but are not limited to, cetyl trimethylammonium bromide (CTAB), heptadecanefluorooctane sulfonic acid, tetraethylammonium, stearyl trimethylammonium chloride, 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, and oxyphenonium bromide, guanidine hydrochloride (C(NH2) 3Cl) or triflate salts such as tetrabutylammonium trifluoromethanesulfonate, dimethyldioctadecylammonium chloride, dimethyldihexadecylammonium bromide, di(hydrogenated tallow)dimethylammonium chloride, and polyoxyethylene (16) tallow ethylmonium ethosulfate. Anionic surfactants contemplated include, but are not limited to, poly(acrylic acid sodium salt), ammonium polyacrylate, sodium polyoxyethylene lauryl ether, sodium dihexylsulfosuccinate, sodium dodecyl sulfate, dioctylsulfosuccinate salt, 2-sulfosuccinate salts, 2,3-dimercapto-1-propanesulfonic acid salt, dicyclohexyl sulfosuccinate sodium salt, sodium 7-ethyl-2-methyl-4-undecyl sulfate, phosphate fluorosurfactants, fluorosurfactants, and polyacrylates. Zwitterionic surfactants include, but are not limited to, acetylenic diols or modified acetylenic diols, ethylene oxide alkylamines, N,N-dimethyldodecylamine N-oxide, sodium cocaminpropinate, 3-(N,N-dimethylmyristylammonio)propanesulfonate, and (3-(4-heptyl)phenyl-3-hydroxypropyl)dimethylammoniopropanesulfonate.

In another embodiment, the composition further comprises a water-miscible solvent and/or adjuvant.

In one embodiment, the water-miscible solvent is chosen from glycols, and glycol ethers, methanol, ethanol, isopropanol, butanol, and higher alcohols chosen from $C_2$-$C_4$ diols and $C_2$-$C_4$ triols, tetrahydrofurfuryl alcohol, such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone, cyclohexylpyrrolidinone, N-octylpyrrolidinone, N-phenylpyrrolidinone, methyldiethanolamine, methyl formate, dimethyl formamide, dimethylsulfoxide, tetramethylene sulfone, diethyl ether, phenoxy-2- propanol, propriophenone, ethyl lactate, ethyl acetate, ethyl benzoate, acetonitrile, acetone, ethylene glycol, propylene glycol, 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, propylene glycol phenyl ether, ethylene glycol monophenyl ether, diethylene glycol monophenyl ether hexaethylene glycol monophenylether, dipropylene glycol methyl ether acetate, tetraethylene glycol dimethyl ether, dibasic ester, glycerine carbonate, N-formyl morpholine, triethyl phosphate, mono and disaccharides, including but not limited to, xylitol, fructose, sucrose, glucose, inositol, galactose, maltoseand combinations thereof.

Further exemplary adjuvants and/or solvents include glycerol, sorbitol, glycol ethers, urea, and dicyandiamide.

In one embodiment, the adjuvents are chosen from compounds which function as hydrogen bonding additives, which serve to reduce silica particles from sticking to brushes utilized in the cleaning of post-CMP microelectronic devices. See, for example, U.S. Patent Publication No. 2019/0168265, incorporated herein by reference. Exemplary compounds include non-ionic, anionic, cationic, and zwitterionic small molecules and polymers that may behave as a polyelectrolyte at neutral pH. Anionic polymers or anionic polyelectrolytes can be natural, modified natural polymers, or synthetic polymers. Exemplary natural and modified natural anionic polymers that can be included in the composition include, but are not limited to: alginic acid (or salts), carboxymethylcellulose, dextran sulfate, poly(galacturonic acid), and salts thereof. Exemplary synthetic anionic polyelectrolytes include, but are not limited to: homopolymers or copolymers of (meth)acrylic acid (or salts), poly(acrylic acid), maleic acid (or anhydride), styrene sulfonic acid (or salts), vinyl sulfonic acid (or salts), allyl sulfonic acid (or salts), acrylamidopropyl sulfonic acid (or salts), and the like, wherein the salts of the carboxylic acid and sulfonic acids are preferably neutralized with an ammonium or alkylammonium cation. In one embodiment, cations of a polyelectrolyte anionic polymer are ammonium cations ($NH_4^+$), cholinium$^+$$N(CH_3)_3(CH_2CH_2OH)$ and $^+N(CH_3)_4$. Thus, examples of combined synthetic and natural polyelectrolyte anionic polymers are homopolymers or copolymers of (meth)acrylic acid, maleic acid (or anhydride), styrene sulfonic acid, vinyl sulfonic acid, allyl sulfonic acid, vinylphosphonic acid, acrylamidopropyl sulfonic acid, alginic acid, carboxymethylcellulose, dextran sulfate, poly(galacturonic acid), and salts thereof.

Cationic polymers and cationic polyelectrolytes can be natural, modified natural polymers, or synthetic polymers. Exemplary natural and modified natural cationic polymers include, but are not limited to: chitosan, cationic starch, polylysine, and salts thereof. Exemplary cationic synthetic polyelectrolytes include but are not limited to: homopolymers or copolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth)acrylate acid addition salts and quaternary salts, N,N'-dimethylaminopropyl acrylamide acid addition salts and quaternized salts, wherein the quaternary salts include alkyl and benzyl quaternized salts; allylamine, diallylamine, vinylamine (obtained by hydrolysis of vinyl alkylamide polymers), vinyl pyridine, chitosan, cationic starch, polylysine, and salts thereof.

Other examples include 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, and diglyme.

Alternatively, or in addition, the hydrogen bonding additives include hydroxypropylcellulose, hydroxyethylcellulose, hydroxyethylmethyl cellulose, hydroxyproplymethyl cellulose, carboxymethylcellulose, sodium carboxymethylcellulose, polyvinylpyrrolidone (PVP), any polymer made using the N-vinyl pyrrolidone monomer, polyacrylic acid esters and analogues of polyacrylic acid esters, polyamino-acids (e.g., polyalanine, polyleucine, polyglycine), polyami-dohydroxyurethanes, polylactones, polyacrylamide, Xanthan gum, chitosan, polyethylene oxide, polyvinyl alcohol (PVA), polyvinyl acetate, polyacrylic acid, polyethyleneimine, sugar alcohols such as sorbitol, sucrose, fructose, lactose, galactose, maltose, erythritol, maltitol, threitol, arabinol, ribitol, mannitol, galactitol, inositol, and xylitol, esters of anhydrosorbitols, secondary alcohol ethoxylates such as TERGITOL™ surfactants, multifunctional alcohols including pentaerytritol, dipentaerythitol, trimethylolpropane, dimethylpropionic acid, and xylonic acid, nucleopbases such as uracil, cytosine, guanine, thymine, and combinations thereof.

Still other examples of hydrogen bonding additives include lactic acid, maleic acid, urea, glycolic acid, sorbitol, borax (i.e., sodium borate), proline, a betaine, glycine, histidine, TRIS (tris(hydroxymethyl) aminomethane), dimethyl sulfoxide, sulfolane, glycerol, SDS (sodium dodecyl sulfate), dodecylphosphonic acid, or a combination thereof.

In another embodiment, the composition further comprises a biocide. Exemplary biocides include 5-chloro-2-methyl-4-isothiazolin-3-one, 2-methyl-4-isothiazolin-3-one, benzisothiazolone, 1, 2-benzisothiazol-3[2H]-one, methyl-isothiazolinone, methylchloroisothiazolinone, and combinations thereof.

In other embodiments, the compositions of the invention comprise:

A. For microelectronic devices having tungsten surfaces:
3-amino-4-octanol,
sorbitol,
glycerol,
poly(styrene sulfonic acid),
polyacrylic acid,
ethanolamine,
etidronic acid,
citric acid,
hydroxyethyl cellulose,
ethanolamine,
choline hydroxide,
triethanolamine, benzoisothiazolinone, and
phosphoric acid;
B. For microelectronic devices having cobalt surfaces and hydrophobic dielectric surfaces:
3-amino-4-octanol,
poly(vinylpyrrolidone),
ethanolamine,
choline hydroxide,
KOH,
etidronic acid
triethylene glycol monobutyl ether, and
Brij 23 (ethoxylated $C_{12}$ alcohol); and
C. For microelectronic devices having copper surfaces:
3-amino-4-octanol,
poly(vinylpyrrolidone),
ethanolamine,
choline hydroxide,
KOH,
etidronic acid
triethylene glycol monobutyl ether
cysteine,
morpholine,
succinic acid,
oxalic acid,
tartaric acid,
dicyandiamide,
propylene glycol monobutyl ether, and
diethylene glycol monobutyl ether.

As used herein, the term "residue" (which is inclusive of a "contaminant") refers to any material that is a chemical or particulate material that remains present at a surface of a microelectronic device substrate after a processing step used in the fabrication of a microelectronic device, for example processing steps including plasma etching, plasma ashing (to remove photoresist from an etched wafer), chemical-mechanical processing, wet etching, etc. The residue may be any non-aqueous chemical material that is part of a processing composition used in the processing step, such as a chemical etchant, a photoresist, a CMP slurry, etc. The residue may alternately be a substance that is derived from a material of the processing composition during a processing step. Examples of these types of residues include non-aqueous, particulate or non-particulate, chemical or abrasive materials (e.g., abrasive particles, surfactant, oxidizer, corrosion inhibitor, catalyst) that remain at a surface of the substrate after processing. The residue may be originally present in a material such as a CMP slurry or an etching composition, such as a solid abrasive particle or chemical material present in a CMP abrasive slurry. Alternately, a residue may be a by-product or a reaction product (in particulate (e.g., agglomerate, precipitate) or non-particulate form) that is generated during processing, e.g., a by-product or reaction product of a chemical present in a processing composition such as CMP slurry or wet etching composition, or a chemical that is present, used during, or produced during a plasma etching or a plasma ashing process.

The term "post-CMP residue" refers to residue that is present at an end of a CMP processing step, for example a particle or chemical material that is present in or derived from a CMP slurry; specific examples include abrasive particles (e.g., silica-containing or silica-based abrasive particles, metal oxide (e.g., alumina) particles, ceria or ceria-based particles and the like); chemicals that are originally present in the slurry such as an oxidizer, catalyst, surfactant, inhibitor, complexing agent, etc.; a metal (e.g., ion), metal oxide, or metal complex that is derived from a metal material removed from the substrate surface being processed; or a reaction product or complex produced using a chemical of the slurry with another chemical of the slurry or with a chemical material derived from the substrate, such as a metal ion; pad particles; or any other material that is a product of the CMP process.

A "post-etch residue" refers to a material remaining following a gas-phase plasma etching process, e.g., back-end-of-line ("BEOL") dual damascene processing, or wet etching processes. A post-etch residue may be organic, organometallic, organosilicic, or inorganic in nature, for example, silicon-containing material, carbon-based organic material, and etch gas residues such as oxygen and fluorine.

A "post-ash residue" refers to material remaining following oxidative or reductive plasma ashing to remove hardened photoresist and/or bottom anti-reflective coating (BARC) materials. The post-ash residue may be organic, organometallic, organosilicic, or inorganic in nature.

As used herein a "low-k dielectric material" is a material used as a dielectric material in a multi-layer microelectronic device, wherein the material has a dielectric constant less than about 3.5. Example low-k dielectric materials include low-polarity materials such as silicon-containing organic polymers, silicon-containing hybrid organic-inorganic materials, organosilicate glass (OSG), tetraethyl orthosilicate (TEOS), fluorinated silicate glass (FSG), and carbon-doped oxide (CDO) glass. A low-k dielectric materials may have a density and a porosity from among a range of useful densities and from a range of useful porosities.

As noted above, the present invention relates to compositions ("cleaning compositions" or "cleaning solutions") that are useful in a cleaning method that removes residue from a surface of a microelectronic device substrate that has residue thereon. Described compositions are alkaline compositions that contain an aqueous carrier (i.e., water) along with a combination of non-aqueous ingredients that include: a complexing agent, and an amino($C_6$-$C_{12}$ alkyl)alcohol. In certain embodiments, the compositions, before being used in a cleaning process, are homogeneous solutions that comprise, consist of, or consist essentially of water and dissolved non-aqueous ingredients, in the absence of any solid or suspended materials such as solid abrasive particles, agglomerates, coagulates, etc.

A composition as described is useful for cleaning microelectronic devices and precursors thereof, specifically including microelectronic device substrates, meaning semiconductor wafers that include on a surface one or more microelectronic devices or precursors thereof that are in the process of being fabricated into final, completed and functional microelectronic devices. As used herein, a microelectronic device is a device that includes electrical circuits and related structures of very small (e.g., micron-scale or smaller) dimensions formed thereon. Exemplary microelectronic devices include flat panel displays, integrated circuits, memory devices, solar panels, photovoltaics, and microelectromechanical systems (MEMS). A microelectronic device substrate is a structure such as a wafer (e.g., semiconductor wafer) that includes one or more microelectronic devices or precursors thereof, in a state of being prepared to form a final microelectronic device.

The compositions and methods described herein are useful to clean any of various forms of microelectronic devices, at any stage of processing. Microelectronic device substrates (or simply "substrates," herein, for short) that can be cleaned with particular utility and benefit include substrates that include exposed cobalt, tungsten, molybdenum, or dielectrics, or all three, at a surface of the substrate.

According to the invention, the compositions can be used for cleaning these general and specific types of microelectronic device substrates to remove residues, such as but not limited to the post-CMP residue, post-ash residue, post-etch residue, or other residue present at a substrate surface following a step of processing a microelectronic device substrate. The cleaning compositions provide useful or advantageous cleaning properties, meaning that the cleaning compositions are capable of being used with known equipment (e.g., post-CMP cleaning equipment), to substantially reduce the amount of residue, contaminant, or both, at a surface of a microelectronic device substrate, with improved levels of adverse effects on such cobalt, tungsten, and dielectric surfaces. A high percentage of residue that is present at a substrate surface can be successfully removed from the surface by use of cleaning compositions and methods described herein, for example at least 70, 80, 85, 90, 95, or 99 percent of residue may be removed (also referred to as "cleaning efficiency").

Methods and equipment for measuring residue at a surface of a microelectronic device substrate are well known. Cleaning efficacy may be rated based on a reduction of an amount (e.g., number) of residue particles present on a microelectronic device surface after cleaning, compared to the amount (e.g., number) of residue particles present before cleaning. For example, pre- and post-cleaning analysis may be carried out using an atomic force microscope. Residue particles on a surface may be registered as a range of pixels. A histogram (e.g., a Sigma Scan Pro) may be applied to filter the pixels in a certain intensity, e.g., 231-235, and the number of residue particles counted. The amount of residue particle removal, i.e., cleaning efficiency, may be calculated using the ratio:

(Number of PreClean Residue Particles on a Surface−Number of PostClean Residue Particles on the Surface)/(Number of PreClean Residue Particles on the Surface).

Alternately, cleaning efficacy may be considered as a percentage of a total amount of a substrate surface that is covered by residue particulate matter before as compared to after cleaning. For example, an atomic force microscope may be programmed to perform a z-plane scan to identify topographic areas of interest above a certain height threshold, and then calculate the area of the total surface covered by the areas of interest. A reduced amount of area determined to be areas of interest, after cleaning, indicates a more efficacious cleaning composition and cleaning process.

In addition to good cleaning efficacy, cleaning processes and cleaning compositions as described also produce a cleaned substrate surface that is affected by an advantageously low amount of corrosion of exposed metal surfaces, such as exposed metallic tungsten, molybdenum, exposed metallic cobalt, or exposed dielectrics. Example substrates that may be cleaned by such a process are substrates that have metallic tungsten or metallic cobalt at a surface, e.g., as a metal interconnect (e.g., tungsten or cobalt interconnect), or a barrier layer material (e.g., cobalt) located between a metal interconnect and a dielectric or a dielectric material. Certain examples of microelectronic device substrates that be cleaned with particularly useful or advantageous results include those that contain exposed structures, at a surface, that include metallic tungsten (e.g., tungsten or an alloy thereof), metallic cobalt (e.g., cobalt or an alloy thereof), and dielectric material. Corrosion inhibition of a cleaning composition can be reflected in a measurement of metal etching rate, such as static etching rate, which can be performed by known methods using known equipment.

The compositions of the invention can be prepared and then sold in the form a concentrate, which contains water at a relatively low amount, and, consequently, a relatively concentrated amount of non-aqueous ingredients. The concentrate is prepared commercially to be sold and transported while containing the concentrated amount of non-aqueous ingredients and relatively reduced amount of water, and to be eventually diluted by a purchaser of the concentrate at a point of use. The amounts of the different non-aqueous ingredients in the concentrate are amounts that, upon dilution of the concentrate, will result in desired amounts of those non-aqueous ingredients being present in the use composition.

The composition as described includes water as a liquid carrier, i.e., solute, of the non-aqueous ingredients. The water can be deionized (DIW) water. Water can be present in the composition from any source, such as by being contained in an ingredient that is combined with other ingredients to produce a composition in the form of a concentrate; or as water combined in pure form to other ingredients of a concentrate; or as water added to a concentrate by a user, e.g., at a point of use, as dilution water for the purpose of diluting the concentrate to form a use composition.

The amount of water in a composition can be a desired amount for a concentrate, or a desired amount of a use composition, which is generally a higher total amount relative to the amount of water in a concentrate. Exemplary amounts of water in a concentrate composition, not to be considered limiting, may be from about 30, 40, or 50 to about 85 or 90 weight percent, e.g., from about 60, 65, or 70 to about 80 weight percent water, based on total weight of a concentrate composition. Upon dilution, these amounts will be reduced by a factor of the dilution. Example amounts of water in a use composition may be from about 75 to about 95 weight percent, e.g., from about 82 or 85 to about 90 or 93 weight percent water based on total weight of the use composition.

The compositions of the invention contain an amino($C_6$-$C_{12}$ alkyl)alcohol as a primary cleaning compound. As a secondary cleaning compound, the compositions may optionally further contain a $C_2$-$C_4$ alkanolamine such as monoethanolamine as a secondary cleaning compound.

In another embodiment, the composition further comprises an additional cleaning compound. Some specific examples of such additional cleaning compounds include:

a. morpholine, L-cysteine, dicyandiamide, hydroxy ethyl cellulose, polyvinylpyrrolidone, a polyamine, and combinations thereof; and b. alginic acid and salts thereof; carboxymethylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth)acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride, diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth)acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl)carboxymethylbetaine; oleyldimethyl-gamma-carboxypropylbetaine; lauryl-bis-(2-hydroxypropyl)alpha-carboxyethylebetaine;
cocodimethylsulfopropylbetaine; stearyldimethylsulfopropylbetaine; lauryl-bis-(2-hydroxyethyl)sulfopropylbetaine; sodium dodecylsulfate; dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-$C_{10\text{-}16}$-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N,N-dimethylammonium chloride; dodecylamine; polyoxyethylene lauryl ether; dodecenylsuccinic acid monodiethanol amide; ethylenediamine tetrakis (ethoxylate-block-propoxylate); 2-pyrrolidinone, and 1-(2-hydroxyethyl)-2-pyrrolidinone (HEP).

The composition of the invention can be easily prepared by simple addition of the respective ingredients and mixing to homogeneous condition, such as a solution. Furthermore, a composition may be readily formulated as single-package formulations or multi-part formulations that are mixed at or before the point of use, e.g., the individual parts of the multi-part formulation may be mixed by a user either at a processing tool (cleaning apparatus) or in a storage tank upstream of the processing tool.

Accordingly, another aspect of the invention relates to a kit including, in one or more containers, one or more components of the composition as set forth herein. The kit may include, in one or more containers, (i) a pH adjustor; (ii) complexing agent; (iii) an amino($C_6$-$C_{10}$ alkyl)alcohol, for combining with additional solvent (e.g., water) at the fab or the point of use. The kit may also include the other optional ingredients recited herein. The containers of the kit must be suitable for storing and shipping the compositions and may be, for example, NOWPak® containers (Entegris, Inc., Billerica, Mass., USA).

Additionally, a composition as described herein may be provided commercially for sale in the form of a concentrate that can be diluted with an appropriate amount of water at a point of use. In a concentrate form, the composition (concentrate) includes non-aqueous ingredients as set forth herein that will be present in the concentrate in amounts such that when the concentrate is diluted with a desired amount of water (e.g., DI water) each component of the cleaning composition will be present in the diluted use composition in an amount that is desired for use in a cleaning step such as a post-CMP cleaning step. The amount of water added to the concentrate to form the use composition may be one or multiple volumes of water per volume of the concentrate, for example 2 volumes of water (e.g., 3, 4, 5, or 10 volumes of water) per volume of the concentrate. When the concentrate is diluted with such an amount of water, each of the solid components of the concentration will be present in the use composition in a concentration that is reduced based on the number of volumes of water added to dilute the concentrate.

A cleaning composition as described can be useful in microelectronic device processing applications that include processes for cleaning a substrate surface by a method such as post-etch residue removal, post-ash residue removal surface preparation, post-CMP residue removal, and the like. Example substrates that may be cleaned by such a process include substrates that include metallic tungsten, metallic cobalt, low-k dielectric material, or all three.

A cleaning composition and cleaning method are effective to remove a substantial amount of residue from the surface, of an amount that is initially present at the surface before the cleaning step. At the same time, the composition and method are effective without causing undue damage to a dielectric material that may be present at the surface, and without causing undue corrosion to materials such as metallic molybdenum, tungsten, copper, or cobalt, also present at surfaces of select substrates. In one embodiment, the cleaning composition can be effective, in a cleaning step, to remove at least 85 percent of residue present on a surface of the substrate prior to residue removal by a cleaning step, or at least 90 of residue, or at least 95 percent of residue, or at least 99 percent of residue initially present before the cleaning step.

In a cleaning step, such as a post-CMP residue cleaning step, a cleaning composition may be used with any of a variety of known, conventional, commercially available cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems, and Ebara Technologies, Inc. products such as 300 mm models (FREX300S2 and FREX300X3SC) and the 200 mm CMP system (FREX200M).

Conditions and timing of a cleaning step can be as desired, and may vary depending on the type of substrate and residue. In use of a composition for cleaning post-CMP residue, post-etch residue, post-ash residue or contaminants from a microelectronic device substrate having same thereon, the cleaning composition may be contacted with the substrate surface for a time of from about 1 second to about 20 minutes, e.g., from about 5 second to 10 minutes, or from about 15 sec to about 5 minutes, at temperature in a range of from about 20° C. to about 90° C., or about 20° C. to about 50° C. Such contacting times and temperatures are illustrative, and any other suitable time and temperature conditions may be useful if efficacious to at least partially, preferably substantially, clean an initial amount of residue from a surface.

Following desired level of cleaning of a device substrate surface, the cleaning compositions used in a cleaning step may be readily removed from the device surface, as may be desired and efficacious in a given end use application. For example, removal may be performed by use of a rinse solution that includes deionized water. Thereafter, the device may be processed as desired, such as by being dried (e.g., using nitrogen or a spin-dry cycle), followed by subsequent processing of the cleaned and dried device surface.

In other more general or specific methods, a microelectronic device substrate may first be subjected to processing step that includes by any one or more of CMP processing, plasma etching, wet etching, plasma ashing, or the like, followed by a cleaning step that includes cleaning the substrate surface with the composition of the present invention. At the end of the first processing step, residue (e.g., post-etch residue, post-CMP residue, post ash residue, etc.) will be present at a surface of the substrate. The cleaning step, using a cleaning composition as described, will be effective to clean a substantial amount of the residue from the microelectronic device surface.

Accordingly, in a further aspect, the invention provides a method for removing residues from a microelectronic device substrate having said residues thereon, wherein the substrate possesses at least one surface comprising a substance chosen from copper, cobalt, tungsten, or a dielectric composition, the method comprising:

contacting the surface of a microelectronic device substrate with a composition comprising:

a. water;

b. a complexing agent; and c. an amino($C_6$-$C_{12}$ alkyl)alcohol;

wherein said composition is devoid of corrosion inhibitors chosen from a guanidine functional compound, a pyrazolone functional compound, or a hydroxyquinoline compound, and at least partially removing said residues from said substrate.

This invention can be further illustrated by the following examples of preferred embodiments thereof, although it will be understood that these examples are included merely for purposes of illustration and are not intended to limit the scope of the invention unless otherwise specifically indicated.

EXAMPLES

The Solutions 1 through 10 as referenced in Table 1, were prepared and used to treat a microelectronic device substrate having either a copper or cobalt surface, in order to evaluate relative etch rates.

Etching rate is a measure of an amount of metal that is removed from a metal surface upon exposing the surface to certain electrolyte, such as a cleaning composition. Metal film thickness was measured by use of X-ray fluorescence (XRF) before and after 15-minute cleaning process at 30° C. temperature and 500 rpm agitation.

TABLE 1

| Materials | CAS # | 1 | 2 | 3 | 4 | 5 | 6 | 7 | 8 | 9 | 10 |
|---|---|---|---|---|---|---|---|---|---|---|---|
| Deionized Water | 7732-18-5 | 78.14 | 77.14 | 77.43 | 77.33 | 77.53 | 77.33 | 77.35 | 77.14 | 77.32 | 77.62 |
| 47% Choline Hydroxide | 123-41-1 | 18.00 | 18.00 | 18.00 | 18.00 | 18.00 | 18.00 | 18.00 | 18.00 | 18.00 | 18.00 |
| 59% HEDP* | 2809-21-4 | 1.36 | 1.36 | 1.36 | 1.36 | 1.36 | 1.36 | 1.36 | 1.36 | 1.36 | 1.36 |
| Monoethanolamine | 141-43-5 | 2.50 | 2.50 | 2.50 | 2.50 | 2.50 | 2.50 | 2.50 | 2.50 | 2.50 | 2.50 |
| 3-amino-4-octanol | 1001354-72-8 | | 1.00 | | | | | | | | |
| 5-amino-1-pentanol | 2508-29-4 | | | 0.71 | | | | | | | |
| DL-2-amino-1-hexanol | 5665-74-7 | | | | 0.81 | | | | | | |
| 2-amino-2-methyl-1-propanol | 124-68-5 | | | | | 0.61 | | | | | |
| 2-(Butylamino)ethanol | 111-75-1 | | | | | | 0.81 | | | | |
| 2-Aminocyclohexanol | 6850-38-0 | | | | | | | 0.79 | | | |
| 8-Amino-1-octanol | 19008-71-0 | | | | | | | | 1.00 | | |
| 2-Amino-2-ethyl-1,3-propanediol | 115-70-8 | | | | | | | | | 0.82 | |
| 3-Aminopropanol | 156-87-6 | | | | | | | | | | 0.52 |
| total (grams) | | 100 | 100 | 100 | 100 | 100 | 100 | 100 | 100 | 100 | 100 |

*1-hydroxyethylidene-1,1-diphosphonic acid

Further, as shown in the Table 2, inventive cleaning compositions that contain corrosion inhibitors as described herein, with specific base materials Cu and Co, exhibit lower etch rates as compared to the control solution.

TABLE 2

| | Cu | | Co | |
|---|---|---|---|---|
| | Average | Standard Deviation | Average | Standard Deviation |
| Control (Solution 1) | 5.86 | 0.04 | 2.06 | 0.20 |
| Control + 3-amino-4-octanol | 3.62 | 0.08 | 1.66 | 0.05 |
| Control + 5-amino-1-pentanol | 5.80 | 0.06 | 2.09 | 0.25 |
| Control + DL-2-amino-1-hexanol | 6.03 | 0.10 | 1.99 | 0.24 |
| Control + 2-amino-2-methyl-1-propanol | 6.31 | 0.09 | 2.05 | 0.20 |
| Control + 2-(butylamino)ethanol | 5.42 | 0.07 | 1.88 | 0.17 |
| Control + 2-Aminocyclohexanol | 5.72 | 0.21 | 1.48 | 0.22 |
| Control + 8-Amino-1-octanol | 5.20 | 0.02 | 1.86 | 0.12 |
| Control + 2-Amino-2-ethyl-1,3-propanediol | 5.18 | 0.21 | 1.46 | 0.10 |
| Control + 3-Aminopropanol | 5.48 | 0.03 | 1.86 | 0.15 |

Example 2

The following compositions shown in Table 3 were prepared and tested according to the following procedure:

Etch Rate Procedure:

Coupon Preparation:

Cleave wafer into square coupons with side dimensions between 22 and 24 mm.

Blow off wafers with clean compressed Nitrogen to remove cleave dust. The nozzle should be between 1" and 2" from the wafer surface Beaker Processing:

Premeasure coupons if pre-measurements are specified.

Use the scribed reference to place coupon in a repeatable orientation

Set the desired processing temperature on the hot plate. After the hot plate temperature readout stops flashing (indicating the temperature has been reached), wait an additional 30 minutes before processing coupons.

Prepare 2 400 ml beaker with 250-350 ml of DIW to be used for rinses. One (for the first rinse) should be located inside the hood near the hot plate, and the other (for the overflow rinse) should be in the sink under the DIW supply Place coupons in beaker using blue clips with active side facing into the flow of the chemistry.

Remove all coupons at desired time(s).

Dip the clip and coupon into a 400 ml Teflon beaker filled with 250-350 ml of DIW for 1 to 3 seconds. The purpose of this step is to remove the majority of formulation adhering to the wafer and clip before the overflow rinse Move the clip and coupon to a beaker in the sink with continuous flow (overflow rinse) for 2 minutes for Cu and 10 seconds for Co.

Blow DIW off the coupon. Blow off with compressed N2 with the nozzle between 1 and 2" away from the coupon. Start opposite the clip and move the N2 stream down the wafer. Move the water as a sheet as much as possible, avoiding having droplets dry on the wafer surface.

Post measure coupons

TABLE 3

| Blend order | Raw material | CAS no. | pH = 13.8 Co-S1 | pH = 13.8 Co-S2 |
|---|---|---|---|---|
| 1 | DIW water | 7732-18-5 | 77.24 | 76.44 |
| 3 | HEDP (59%) | 9003-39-8 | 1.36 | 1.36 |
| 4 | MEA | 141-43-5 | 2.5 | 2.5 |

TABLE 3-continued

| | | | | NO | 0.8 |
|---|---|---|---|---|---|
| 5 | 3-amino-4-octanol | 1001354-72-8 | | NO | 0.8 |
| 6 | KOH (45%) | 1310-58-3 | | 18.9 | 18.9 |

| | Average | Standard deviation |
|---|---|---|
| Co-S1 | 0.493 | 0.087 |
| Co-S2 | 0.231 | 0.015 |

Example 3: Polishing Data

Samples A and B shown in Table 3 were diluted with 99 parts water and 1 part of the sample. TEOS (silicon dioxide) and/or silicon nitride wafers were polished with a silica based commercially available slurry on a Reflexion LK and then cleaned on the integral PVP brush station using Entegris Planarcore® brushes for 120 seconds. The wafers were then analyzed by a KLA-TENCORE SP3 at a 65 nm threshold and then categorized by a SEMVISION SEM Scratches and pits were removed as they are not related to the cleaning process and the total defects is the sum of the silica defects plus any organic residue defects.

The invention has been described in detail with particular reference to certain embodiments thereof, but it will be understood that variations and modifications can be effected within the spirit and scope of the invention

TABLE 3

| Sample | | TEOS Defects | Si₃N₄ Defects |
|---|---|---|---|
| A1 (comparative) | 9% citric acid, 6% Sorbitol, 0.95% formic acid, 0.5% Poly(acrylic acid) 0.01% Hydroxyethyl Cellulose, 0.5% Sulfonated poly(acrylic acid) pH adjust to 4.5 with Choline hydroxide | 33 | 282 |
| A2 (invention) | 9% citric acid, 6% Sorbitol, 0.95% formic acid, 0.5% Poly(acrylic acid) 1% 3-Amino-4-octanol pH adjust to 4.5 with Choline hydroxide | 0 | 0 |
| B1 (comparative) | 0.45% ethanolamine, 0.26% dicyandiamide, 0.3% tartaric acid, 0.03% cysteine, 3% propylene glycol monobuyl ether, pH adjust to 13.7 with Choline Hydroxide | 219 | ND* |
| B2 (comparative) | 4.5% ethanolamine, 0.1% tartaric acid, 0.05% cysteine, pH adjust to 13.7 with Choline Hydroxide | 18 | ND |
| B3 (invention) | 0.65% ethanolamine, 0.96% succinic acid, 0.03% cysteine, 0.5% 3-amino-4-octanol, pH adjust to 13.7 with Choline Hydroxide | 10 | ND |

*No Defects

The invention claimed is:

1. A composition comprising:
water;
a complexing agent; and
an amino($C_6$-$C_{12}$ alkyl)alcohol;
wherein said composition is devoid of a guanidine functional compound, a pyrazolone functional compound, and a hydroxyquinoline compound, and wherein the pH of the composition is between about 1.5 and 6.

2. The composition of claim 1, wherein the amino($C_6$-$C_{12}$ alkyl)alcohol is an amino($C_8$-$C_{10}$ alkyl)alcohol.

3. The composition of claim 1, further comprising a $C_2$-$C_4$ alkanolamine.

4. The composition of claim 1, wherein the complexing agent is selected from the group consisting of 4-(2-hydroxyethyl) morpholine; 1,2-cyclohexanediamine-N,N,N',N'-tetraacetic acid, hydroxyethyldiethylenetraminetriacetic acid; ethylenediaminetetraacetic acid; m-xylenediamine; iminodiacetic acid; trimethylamine: isopropanolamine: diisopropanolamine; piperazine; hydroxyethylpiperazine; dihydroxyethylpiperizine; glucamine; N-methylglucamine; 2-(hydroxyethyl) iminodiacetic acid; nitrilotriacetic acid; thiourea; 1,1,3,3-tetramethylurea; urea; uric acid;

amino acids selected from alanine; arginine; asparagine; aspartic acid; cysteine; glutamic acid; glutamine; histidine; isoleucine; leucine; lysine; methionine; phenylalanine; proline; serine; threonine; tryptophan; tyrosine; valine; taurine; betaine;

compounds comprising phosphonic acid moieties selected from 1-hydroxyethylidene-1,1-diphosphonic acid; 1,5,9-triazacyclododecane-N,N',N"-tris(methylenephosphonic acid); 1,4,7,10-tetraazacyclododecane-N,N',N", N"'-tetrakis(methylenephosphonic acid); nitrilotris (methylene)triphosphonic acid; diethylenetriaminepentakis(methylenephosphonic acid); aminotri(methylenephosphonic acid); bis(hexamethylene)triamine pentamethylene phosphonic acid; 1,4,7-triazacyclononane-N,N',N"-tris(methylenephosphonic acid; hydroxyethyldiphosphonate; nitrilotris(methylene)phosphonic acid; and carboxylic acids selected from 2-phosphono-butane-1,2,3,4-tetracarboxylic; carboxy ethyl phosphonic acid; aminoethyl phosphonic acid; glyphosate; ethylene diamine tetra(methylenephosphonic acid); phenylphosphonic acid; carboxylic acids chosen from oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, picolinic acid, dipicolinic acid, salicylic acid sulfosalicylic acid, sulfophthalic acid, sulphosuccinic acid, gluconic acid, tartaric acid, glucuronic acid, 2-carboxypyridine) and sulfonic acids chosen from (4,5-Dihydroxy-1,3-benzenedisulfonic acid disodium salt.

5. The composition of claim 1, wherein the amino($C_6$-$C_{10}$ alkyl)alcohol is selected from the group consisting of 3-amino-4-octanol; DL-2-amino-1-hexanol; 2-(butylamino) ethanol; 1-aminocyclohexanol; and 8-amino-1-octanol.

6. The composition of claim 1, wherein the amino($C_8$-$C_{12}$ alkyl)alcohol comprises 3-amino-4-octanol.

7. The composition of claim 1, further comprising a water-soluble or water-dispersible polymer.

8. The composition of claim 1, further comprising a biocide.

9. The composition of claim 1, further comprising a surfactant.

10. The composition of claim 1, further comprising a water miscible solvent and/or adjuvant.

11. The composition of claim 10, wherein the water-miscible solvent and/or adjuvant is selected from the group consisting of glycerol, sorbitol, glycol ethers, and urea.

12. The composition of claim 1, further comprising:
choline hydroxide;
and
monoethanolamine.

13. The composition of claim 12 wherein the amino($C_8$-$C_{12}$ alkyl)alcohol is selected from the group consisting of 3-amino-4-octanol; DL-2-amino-1-hexanol; 2-(butylamino) ethanol; 1-aminocyclohexanol; and 8-amino-1-octanol.

14. The composition of claim 13, further comprising sorbitol.

15. The composition of claim 1, wherein the composition is a concentrate that contains less than 80 weight percent water.

16. The composition of claim 1, further comprising a compound selected from the group consisting of morpholine, L-cysteine, dicyandiamide, hydroxy ethyl cellulose, polyvinylpyrrolidone, a polyamine, and combinations thereof.

* * * * *